US007126321B2

(12) United States Patent
Shioiri et al.

(10) Patent No.: US 7,126,321 B2
(45) Date of Patent: Oct. 24, 2006

(54) APPARATUS AND METHOD FOR MEASURING TRANSMISSION DELAY TIME OF A SIGNAL PROPAGATION PATH BETWEEN PRINTED CIRCUIT BOARDS

(75) Inventors: Satomi Shioiri, Tokyo (JP); Kiyoshi Fukuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/339,631

(22) Filed: Jan. 26, 2006

(65) Prior Publication Data
US 2006/0164066 A1    Jul. 27, 2006

(30) Foreign Application Priority Data
Jan. 26, 2005    (JP)    ............................. 2005-017594

(51) Int. Cl.
*G01R 23/16*    (2006.01)
(52) U.S. Cl. ................................. 324/76.21; 324/76.19
(58) Field of Classification Search ............. 324/76.19, 324/76.21
See application file for complete search history.

(56) References Cited

U.S. PATENT DOCUMENTS 4,279,019 A  *  7/1981  Heyser ....................... 702/140
4,654,808 A  *  3/1987  Potter et al. ................. 702/111
6,208,946 B1 *  3/2001  Arakawa et al. .............. 702/77
2006/0020410 A1 *  1/2006  Hsu et al. .................... 702/106

FOREIGN PATENT DOCUMENTS

JP    2004-104235    4/2004

* cited by examiner

*Primary Examiner*—Walter Benson
(74) *Attorney, Agent, or Firm*—Dickstein Shapiro LLP

(57) ABSTRACT

Transmission delay time measurement is performed on a signal propagation path between respective points of two printed circuit boards connected by a coaxial cable. Measurement is made of a frequency-domain response of the cable and a first time-domain response of the propagation path at its sending point and a second time-domain response of the propagation path at its receiving point. From the first time-domain response and the frequency-domain response, estimation is made of a third time-domain response of the propagation path that would be observed at the receiving point if there is no waveform distortion on the surface of the printed circuit boards. Time-domain correlation is calculated between the second and third time-domain responses. A first delay time is determined from the estimated time-domain response and a second delay time is determined from the correlation. The first and second delay times are summed to yield the transmission delay time of the propagation path.

36 Claims, 11 Drawing Sheets

APPARATUS AND METHOD FOR MEASURING TRANSMISSION DELAY TIME OF A SIGNAL PROPAGATION PATH BETWEEN PRINTED CIRCUIT BOARDS

BACKGROUND OF THE INVENTION

1. Field of the Invention

The present invention relates to a technique for measuring the propagation delay of a transmission system, and more specifically to an apparatus and method for accurately measuring the transmission delay time of a signal propagation path between printed circuit boards by efficiently extracting a significantly attenuated high-speed broadband signal at the receiving point of the path. The present invention is particularly useful for a transmission link that transports high-speed broadband signals, such as rectangular pulses at frequencies higher than 100 MHz.

2. Description of the Related Art

The recent tendency toward using high-speed broadband signals has created a need for a precision measurement of their propagation delay time from output ports of an integrated circuit chip on a first printed circuit board to input ports of an integrated circuit chip on a second printed circuit board. The measured delay time data is used to precisely align delay timings between chip-to-chip parallel transmission channels for canceling inter-channel crosstalk. Two methods are currently available for determining the propagation delays. In one method, a sampling oscilloscope is used to directly evaluate time-domain responses (waveforms). According to the other method that is shown and described in Japanese Patent Publication 2004-104235, a network analyzer is used to calculate the inverse Fourier transform of the frequency-domain response characteristic of a transmission channel. Based on the result of this calculation, the network analyzer calculates the delay time of the channel.

If the transmission channel is designed to carry a broadband signal, the transmitted signal would be severely weakened by the inherent high-frequency loss of the transmission channel, so that it reduces significantly to a low level at the receive end of the channel in comparison with the level of random noise introduced to the channel.

If an oscilloscope were used to measure the delay time of a broadband signal on a noisy transmission medium it is necessary to suppress the noise component of the received signal. In order to suppress the random noise of a transmission channel, a test signal is transmitted at periodic intervals over the channel. To increase the signal-to-noise ratio at the receive end, the received signal is sampled at intervals, and the sample values are averaged over time. Since the number of samples necessary to achieve a desired signal-to-noise ratio depends on the level of the received signal, it is necessary to continue reception for a long period of time until a sufficient number of samples are obtained.

If the transmission delay time of a received signal were determined based on the frequency-domain response of the received signal, precision calibration is necessary to measure the frequency-domain response using a network analyzer. This involves the use of a number of standard blank circuit boards to perform calibration in different calibration modes, including open-circuit, loaded-circuit, short-circuit and through-circuit modes. After calibrations are performed for all modes, a pair of blank boards is used to measure the delay time of the transmission channel between them. If precision measurement of the delay time between two IC chips is required, a number of blank circuit boards must be prepared for each printed circuit board under test to perform calibration in open-circuit, loaded-circuit, short-circuit and through-circuit modes.

More specifically, as shown in FIG. 10, for each pair of printed circuit boards to be tested, there are provided a pair of blank circuit boards 401 and 405 to perform open-circuit calibration a pair of blank circuit boards 402 and 406 for load-circuit calibration, a pair of blank circuit boards 403 and 407 for short-circuit calibration, and a blank circuit board 404 for through-circuit calibration. Each blank circuit board is a non-printed circuit board, which is substantially similar in size and shape to, and is formed of the same material as, the tested printed circuit board and is provided with at least one connector to which a different circuit element is attached corresponding to each calibration mode. In the case of the open-circuit calibration, an etched short surface line 421 is attached to the connector 411 to simulate an open circuit. In the case of the loaded-circuit calibration, the connector 412 is connected by an etched short surface line 422 to a 50-ohm termination resistor 423 to serve as a load. In the short-circuit calibration boards 403, 407, the connector 413 is grounded through an etched short surface line 424. In the through-circuit calibration board 404, an etched short surface line 425 is used to connect connectors 414 and 415 to each other. To perform a frequency-domain response calibration, the connectors of each pair of blank circuit boards are connected to the ports 431 and 432 of a network analyzer 430 by cables shown in the dotted lines.

As shown in FIG. 11, when all calibrations are performed, a pair of test boards 502 and 512 is further prepared if it is desired to accurately determine the transmission delay time based on a measured frequency-domain response characteristic of a frequency-domain response test section 500 between two printed circuit boards. Test board 502 is provided with a PCB connector 501 with an input port 503 of the test section 500, the input port 503 being attached through etched lines 504 on the board 502 to a PCB connector 505. Likewise, the test board 512 is provided with a connector 513 with an output port 511 of the test section 500, the port 511 being attached through etched lines 510 to a PCB connector 509. Coaxial cable 507 is connected between the PCB connectors 505 and 509. Connectors 501 and 513 are fitted with ports 526 and 528, respectively, for connection to the network analyzer 430.

Network analyzer 430 has its output port 431 connected to the port 526 using an extension cable 517 and has its input port 432 connected to the port 528 using an extension cable 519. A frequency-domain test signal is transmitted from the output port 503 through the test section 500 to the input port 511.

SUMMARY OF THE INVENTION

It is therefore an object of the present invention to provide an apparatus and method for determining, in a simple yet effective manner, the transmission delay time of a signal propagation path from any point of a first printed circuit board to any point of a second printed circuit board connected to the first printed circuit board through a transmission medium or coaxial cable.

According to a first aspect, the present invention provides an apparatus for measuring the transmission delay time of a signal propagation path between a sending point (such as a transmit pin of an IC chip) on a first printed circuit board and a receiving point (such as a receive pin of an IC chip) on a second printed circuit board, comprising a frequency domain analyzer that measures a frequency-domain response hp(f) of a transmission medium that forms part of the signal propagation path, a time domain analyzer that measures a first time-domain response Et(t) of the propagation path at the sending point and a second time-domain response Er(t) of the propagation path at the receiving point, and a processor that estimates from the measured first time-domain response Et(t) and the measured frequency-domain response hp(f) a third time-domain response Er2(t) of the propagation path which would be observed at the receiving point if there is no waveform distortion over the surface of each of the printed circuit boards, calculates a time-domain correlation Cor(t) between the measured second time-domain response Er(t) and the estimated third time-domain response Er2(t), determines a first delay time Td from the estimated third time-domain response Er2(t), and determines a second delay time ΔTd from the calculated time-domain correlation Cor(t), and provides a sum of the first and second delay times to produce a transmission delay time of the signal propagation path.

In a first embodiment of the present invention, the processor estimates the third time-domain response Er2(t) by converting the frequency-domain response hp(f) to an impulse response Hp(t) and performing a convolutional integration on the impulse response Hp(t) and the first time-domain response Et(t).

In a second embodiment, the processor estimates the third time-domain response Er2(t) of the propagation path by converting the first and second time-domain responses Et(t) and Er(t) to first and second frequency-domain responses et(f) and er(f) respectively, and multiplying the first frequency-domain response et(f) by the measured frequency-domain response hp(f) to estimate a third frequency-domain response er2(f) of the propagation path which would be observed at the receiving point, and converting the estimated third frequency-domain response er2(f) to the third time-domain response Er2(t).

According to a second aspect of the present invention, there is provided a method of measuring the transmission delay time of a signal propagation path between a sending point of a first printed circuit board and a receiving point of a second printed circuit board, comprising the steps of (a) measuring a frequency-domain response hp(f) of a transmission medium that forms part of the signal propagation path and measuring a first time-domain response Et(t) of the propagation path at the sending point and a second time-domain response Er(t) of the propagation path at the receiving point, (b) estimating from the measured first time-domain response Et(t) and the measured frequency-domain response hp(f) a third time-domain response Er2(t) of the propagation path which would be observed at the receiving point if there is no waveform distortion over the surface of each of the printed circuit boards, (c) calculating a time-domain correlation Cor(t) between the measured second time-domain response Br(t) and the estimated third time-domain response Er2(t), (d) determining a first delay time Td from the estimated third time-domain response Er2(t) and determining a second delay time ΔTd from the calculated time-domain correlation Cor(t), and (e) summing the first and second delay times to produce a transmission delay time of the signal propagation path.

According to a third aspect, the present invention provides a computer-readable storage medium storing a program for measuring the transmission delay time of a signal propagation path between a sending point of a first printed circuit board and a receiving point of a second printed circuit board by measuring a frequency-domain response of a transmission medium that forms part of the signal propagation path and measuring a first time-domain response of the propagation path at the sending point and a second time-domain response of the propagation path at the receiving point, the program comprising the steps of (a) estimating, from the measured frequency-domain response and the measured first time-domain response, a third time-domain response which would be observed at the receiving point if there is no waveform distortion over the surface of each of the printed circuit boards, (b) calculating a time-domain correlation between the measured second time-domain response and the estimated third time-domain response, (c) determining a first delay time from the estimated third time-domain response and determining a second delay time from the calculated time-domain correlation, and (d) summing the first and second delay times to produce a transmission delay time of the signal propagation path.

BRIEF DESCRIPTION OF THE DRAWINGS

The present invention will be described in detail with reference to the following drawings, in which.

DETAILED DESCRIPTION

Figure 1:
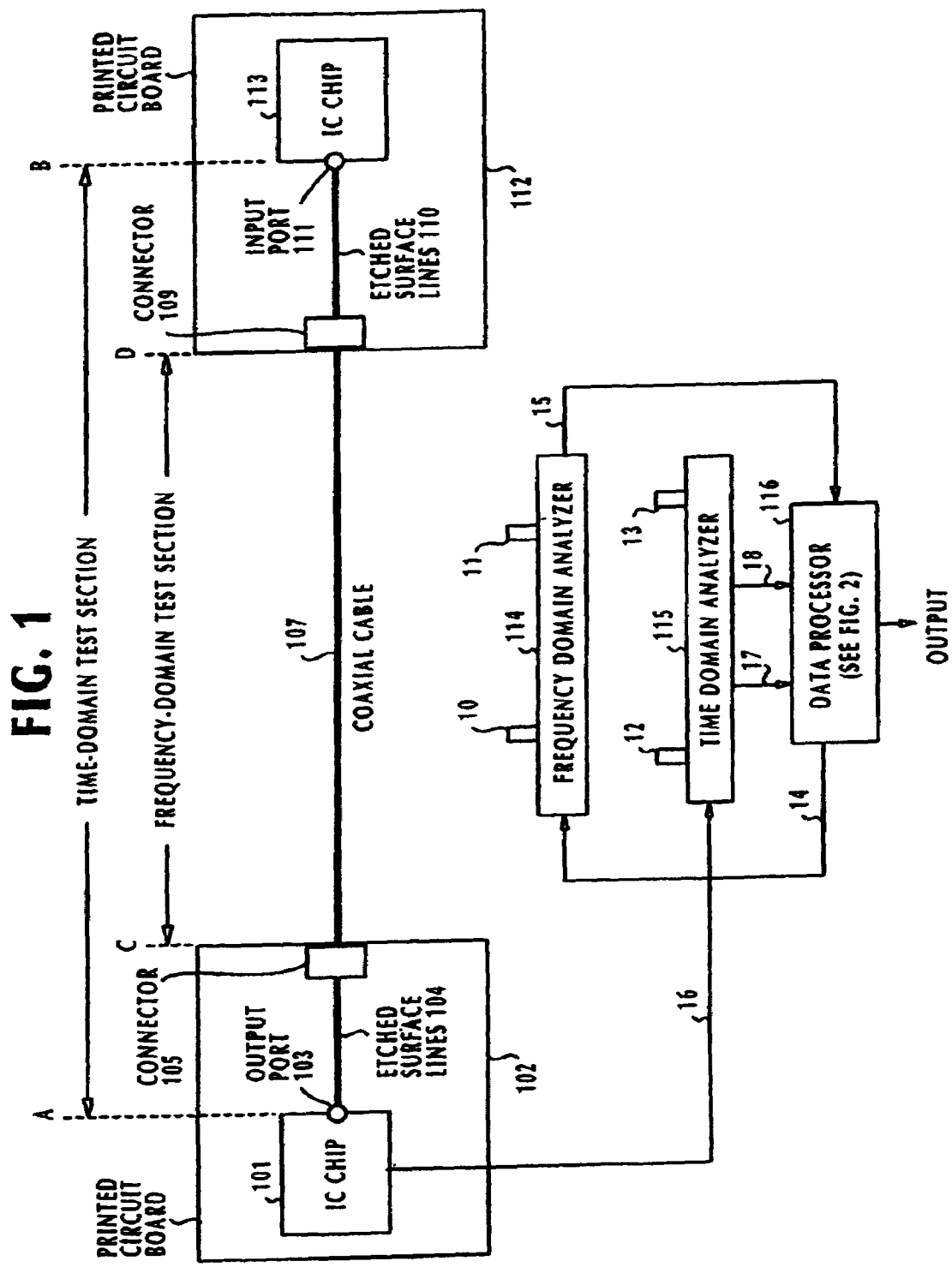
FIG. 1 is a block diagram of an apparatus of the present invention for measuring the propagation delay time of a signal propagation path between two integrated circuit chips respectively mounted on printed circuit boards.

Referring now to FIG. 1, there is shown a transmission delay time measuring apparatus according to a first embodiment of the present invention for measuring a transmission delay time between two printed circuit boards 102 and 112.

On the printed circuit board 102 is an integrated circuit (IC) chip 101 having an output port 103, which is coupled to a PCB connector 105 such as SMA (subminiature-A) connector through a plurality of etched surface lines 104 etched on the surface of the printed circuit board 102. Similarly, there is an IC chip 113 on the printed circuit board 112, the IC chip 113 having an input port 111, which is coupled to an SMA connector 109 through etched surface lines 110. A coaxial cable 107 extends between the PCB connectors 105 and 109 to connect the printed circuit boards 102 and 112.

Time-domain measurements will be made on a time-domain test section that extends between point-A and point-B where the output port 103 and input port 111 are respectively located. Frequency-domain measurement will be made on a frequency-domain test section that extends between point-C and point-D that respectively coincide with the opposite ends of the coaxial cable 107.

Transmission delay time measuring apparatus of the first embodiment of this invention includes a frequency domain analyzer 114 (or network analyzer) and a time domain analyzer 115 (or oscilloscope). Time domain analyzer 115 is provided with "probes" that allow access to any point of the printed circuit boards. The measuring apparatus operates initially in a frequency domain test mode and subsequently in a time domain test mode. During the frequency domain test mode, the cable 107 is disconnected from the PCB connectors 105 and 109. During the subsequent time domain test mode, the cable 107 is reconnected between the connectors 105 and 109.

Frequency domain analyzer 114 has a first port 10 and a second port 11. During a frequency domain test mode, the cable is disconnected from the connectors 105 and 109 and reconnected between the first and second ports 10 and 11 of the frequency domain analyzer as described later.

Time domain analyzer 115 has an input port 12 and an output port 13 to which probe wires will be respectively connected to access the IC chips. During a subsequent time-domain test mode, the cable 107 is reconnected between the two printed circuit boards and the input and output ports 12 and 13 of the time-domain analyzer are connected to the output port 103 and the input port 111, respectively, using the probe wires. At periodic intervals, the IC chip 101 transmits a time-domain test signal from its output port 103 through the time-domain test section to the input port 111 of IC chip 113. The periodic time-domain test signal is either a single pulse or a pulse train transmitted from the IC chip 101 at predetermined intervals. A trigger signal that is synchronized with the transmission of each time-domain test signal is supplied from the IC chip 101 to the time domain analyzer 115. In response to the trigger signal, the time domain analyzer 115 initiates a time-domain test over the time-domain test section A-B in a manner as described later.

In the measuring apparatus of this invention, a data processor 116 is provided, which supplies a start command signal to the frequency domain analyzer 114 through line 14 to cause it to transmit a frequency-domain test signal to the coaxial cable 107 and receives frequency-domain response data therefrom through line 15. In response to each trigger signal, the IC chip 101 transmits a single pulse or a pulse train from its output port 103 through the time-domain test section to the input port 111 of IC chip 113. Data processor 116 receives measurement data from the time domain analyzer 115 through lines 17 and 18.

Figure 2:
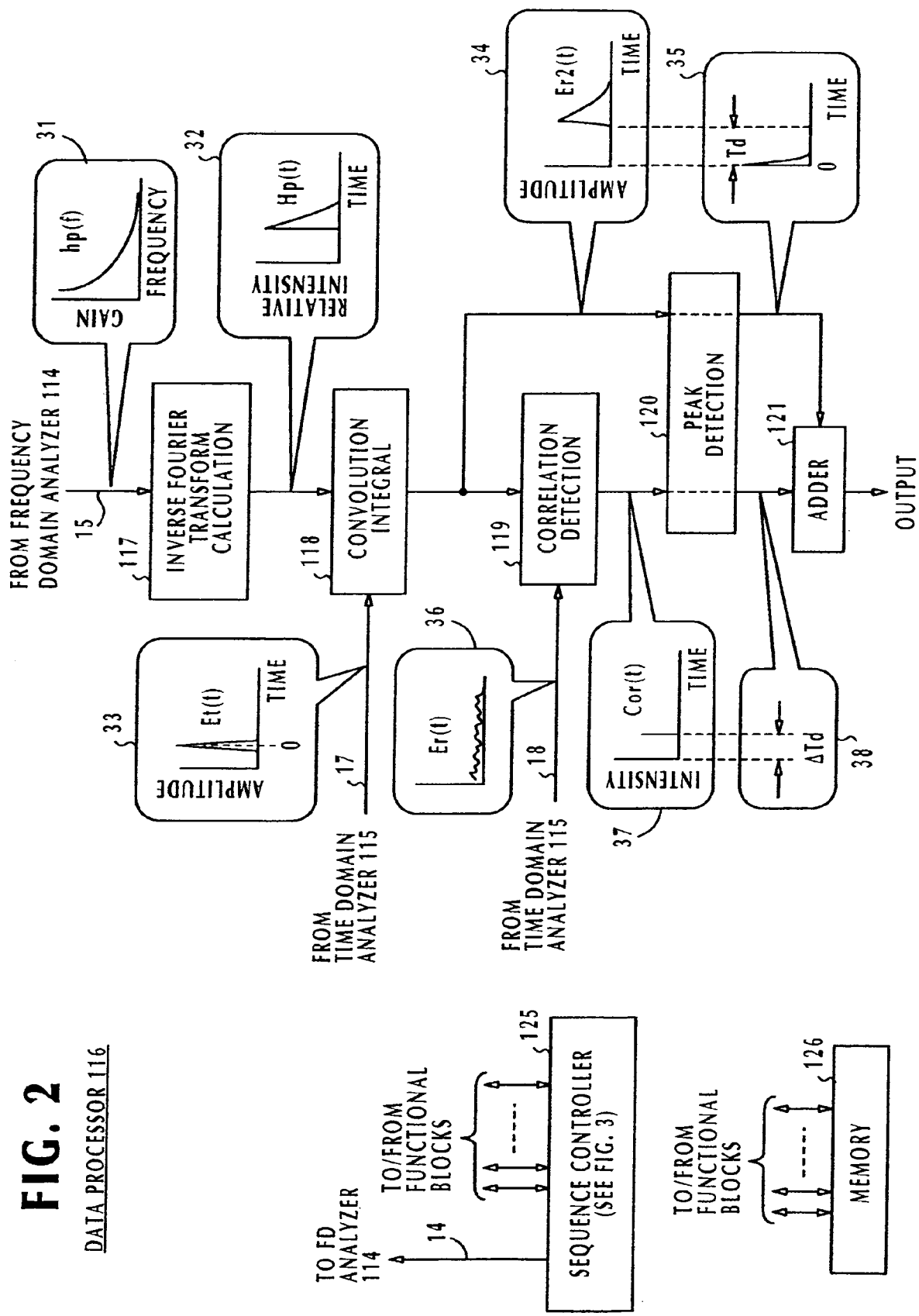
FIG. 2 is a functional block diagram of a data processor of the measuring apparatus that processes the outputs of a frequency domain analyzer and a time domain analyzer according to a first embodiment of the present invention.

Data processor 116 may be implemented with a personal computer. As shown in FIG. 2, the data processor 116 comprises a plurality of functions either software-implemented or hardware-implemented blocks 117 through 121. A sequence controller 125 and a memory 126 are provided. All functional blocks are connected to the sequence controller 125 and the intermediate results of their processes are temporarily stored in the memory 126.

Figure 3:
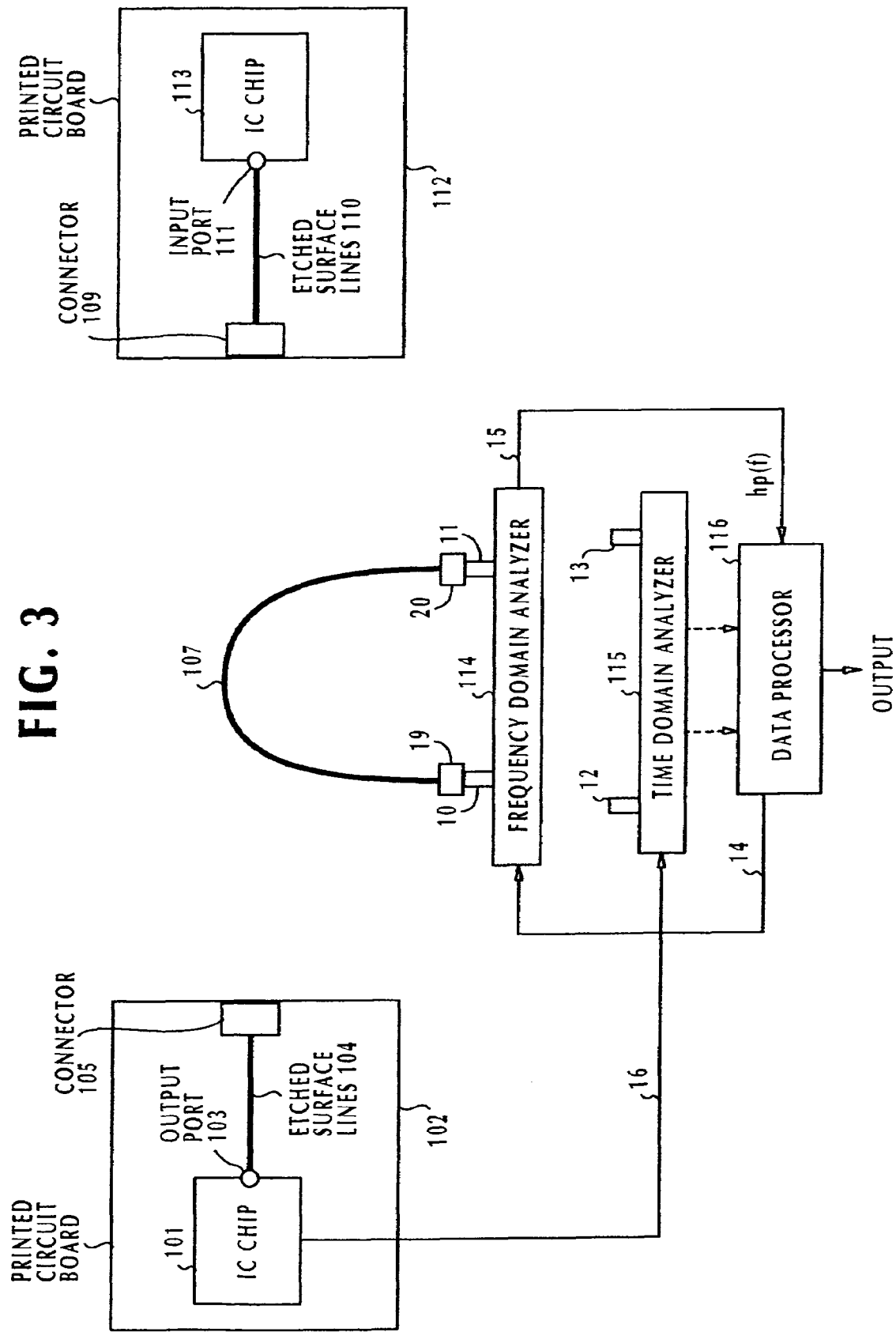
FIG. 3 is a block diagram of the transmission delay time measuring apparatus operating in a frequency domain test mode for measuring the frequency-domain response of a transmission medium that connects the printed circuit boards and forms part of the signal propagation path by disconnecting the transmission medium from the printed circuit boards.

As shown in FIG. 3, during a frequency domain test mode, the coaxial cable 107 is disconnected from both printed circuit boards 102 and 112 and connected to the first and second ports 10 and 11 of the frequency domain analyzer 114 using connectors 19 and 20.

Sequence controller 125 supplies a start command signal to the frequency domain analyzer 114 to cause it to send a high-frequency test signal from its first port 10 into the coaxial cable 107. Then, the frequency domain analyzer 114 performs the same process in the opposite direction so that the same high-frequency test signal is sent from the second port 11 into the coaxial cable 107. During the time the test signal is sent from the first port 10 to the second port 11, the frequency domain analyzer 114 monitors these ports and detects a near-end signal that reflects from the first port 10 and a far-end signal received at the second port 11. During the time the same test signal is sent in the opposite direction, the frequency domain analyzer 114 detects a near-end signal that reflects from the second port 11 and a far-end signal received at the first port 10.

By using the detected near-end and far-end signals, the frequency domain analyzer 114 measures the amplitude and phase of each signal at the sending point of the cable and their corresponding variations at the receiving point and determines their scattering parameter "$s_{21}$" (transfer coefficient). Using the values of the determined scattering parameter, the frequency domain analyzer 114 performs calibrations at both sending and receiving points and determines a frequency-domain response hp(f) of the coaxial cable 107, as indicated by a curve 31 (FIG. 2) which is represented by gain plotted as a function of frequency. Although not shown, the frequency-domain response data additionally includes a graph represented by a phase-versus-frequency curve. In this way, a high degree of frequency-domain response characteristic can be obtained (see step 201, FIG. 5).

Data processor 116 receives this frequency-domain response characteristic data hp(f) through line 15. Data processor 116 includes inverse Fourier transform calculation block 117 that performs inverse Fourier transform on the received frequency-domain response data to provide frequency-to-time domain conversion so that the frequency-domain response of the coaxial cable is converted to an impulse response as given by the following relation (step 202, FIG. 5):

$$Hp(t)=F^{-1}(hp(f)) \quad (1)$$

As indicated by a graph 32, FIG. 2, the impulse response data Hp(t) is represented by a relative intensity plotted as a function of time. The impulse response data Hp(t) is stored in the memory 126 for later use.

Figure 4:
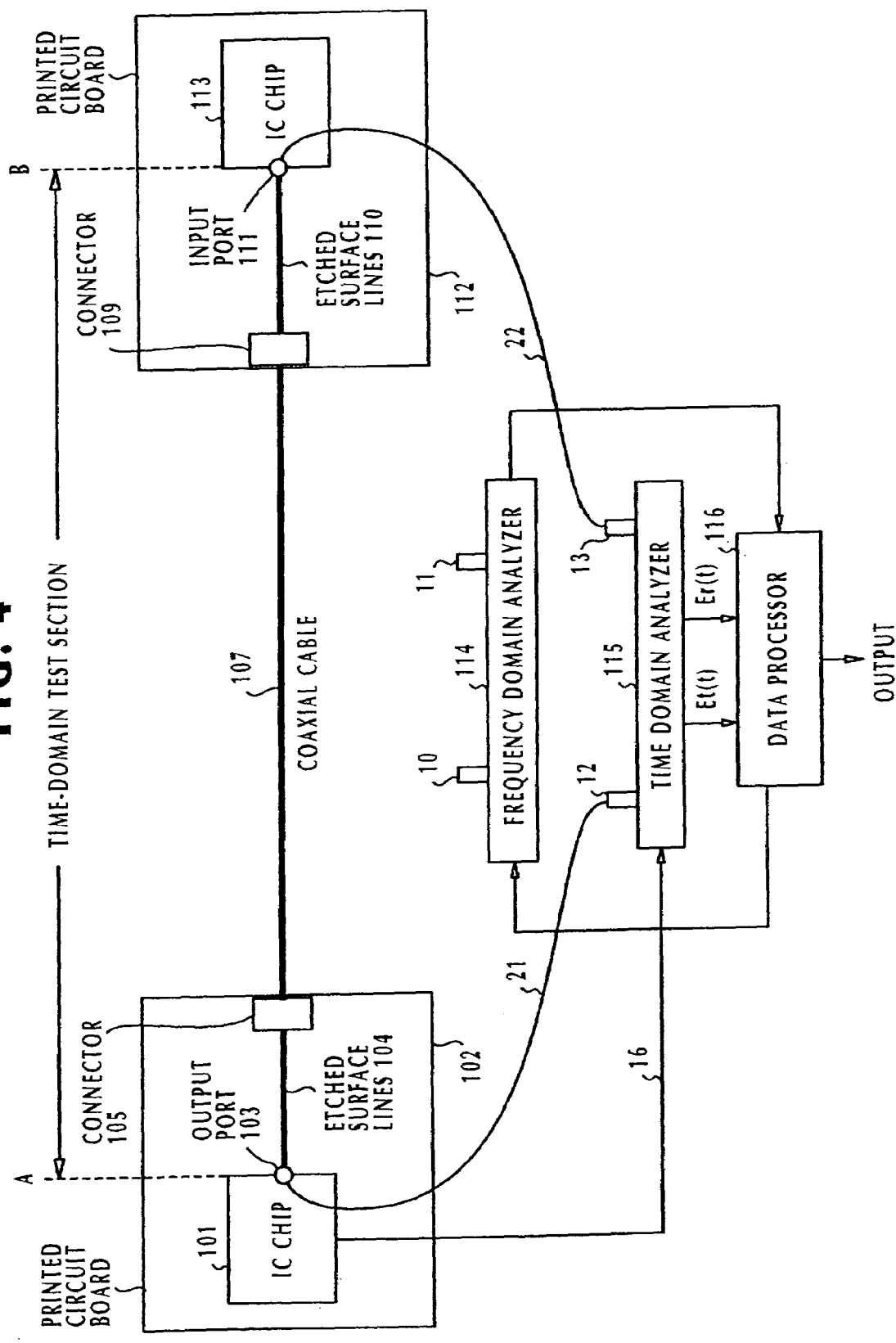
FIG. 4 is a block diagram of the measuring apparatus operating in a time domain test mode for measuring the time-domain responses of the signal propagation path after the transmission medium is reconnected between the printed circuit boards.

During a subsequent time domain test mode, the coaxial cable 107 is reconnected between both printed circuit boards 102 and 112 as shown in FIG. 4. The output and input ports 12 and 13 of time domain analyzer 115 are connected through probe wires 21 and 22 to the output port 103 of IC chip 101 (i.e., the sending point of time-domain test section A-B) and the input port 111 of the IC chip 113 (i.e., the receiving point of time-domain test section A-B).

In synchronism with each trigger signal the IC chip 101 transmits a time-domain test signal from its output port 103 into the time domain test section A-B. Time domain analyzer 115 observes the propagation of the test signal using probe wires 21, 22 and samples the pulses at the sending point A and the receiving point B, so that a relatively high SNR test signal is obtained at point A and a relatively low SNR signal is obtained at point B. From the relatively high SNR test signal, the time domain analyzer 115 generates output data Et(t) representing a sending-point time-domain response (waveform) of the time-domain test section. From the received low SNR test signal the time domain analyzer 115 generates output data Er(t) representing a receiving-point tine-domain response of the time-domain test section (see step 203, FIG. 5).

As shown in FIG. 2, the sending-point time-domain response Et(t) and the receiving-point time-domain response Er(t) are represented by amplitude plotted as a function of time, as indicated by graphs 33 and 36, respectively.

Then, the sequence controller 125 enables convolution integral calculation block 118 to read the stored impulse response data Hp(t) from the memory 126. Data processor 116 receives the time-domain response data Et(t) from the time domain analyzer 115 through line 17, and calculates the following Equation (2) to estimate a time-domain response Er2(t) as indicated by a graph 34 (FIG. 2), which would be observed at the receiving point B if there is no waveform distortion over the surface of each printed circuit board (if this is the case, the time-domain responses at point-A and point-C are identical in shape to each other and the time-domain responses at point-D and point-B are also identical in shape to each other (see step 204, FIG. 5):

$$Er2(t) = \int Et(\tau)Hp(t-\tau)d\tau \quad (2)$$

Correlation calculation block 119 then receives the time-domain response data Er(t) from the time domain analyzer 115 through line 18. In order to extract the received weak signal from noise, correlation calculation block 119 solves the following Equation (3) to calculate a correlation Cor(t) (as indicated by a graph 37, FIG. 2) between time-domain responses Er(t) and Er2(t) (see step 205, FIG. 5):

$$Cor(t) = \int Et(t-\tau)Er2(\tau)d\tau \quad (3)$$

Peak detection block 120 detects a peak point at the estimated time-domain response Er2(t) and determines the propagation delay time Td between point-A and point-B from the time position of the detected peak point (see step 206, FIG. 5) as indicated by a graph 35, FIG. 2.

Alternatively, the delay time Td can be determined as a difference between the rising point of the time domain response Et(t) (graph 33) and the rising point of the estimated time domain response Er2(t) (graph 34).

If the periodic time-domain test signal is a pulse train, multiple peaks may occur in the time-domain responses. In this case, it is particularly advantageous to determine the transmission delay time Td by detecting peaks in the time-domain responses Et(t) and Er2(t) and determining a timing difference Td between the peak detected in the time-domain response Et(t) (see graph 33) and the peak detected in the estimated tine-domain response Er2(t) (see graph 34).

Additionally, the delay time Td can also be determined by solving the inverse Fourier transform of the estimated time-domain response Er2(t) to produce a frequency-domain response and differentiating the frequency-domain response to obtain a group delay for each of its spectral components.

Figure 5:
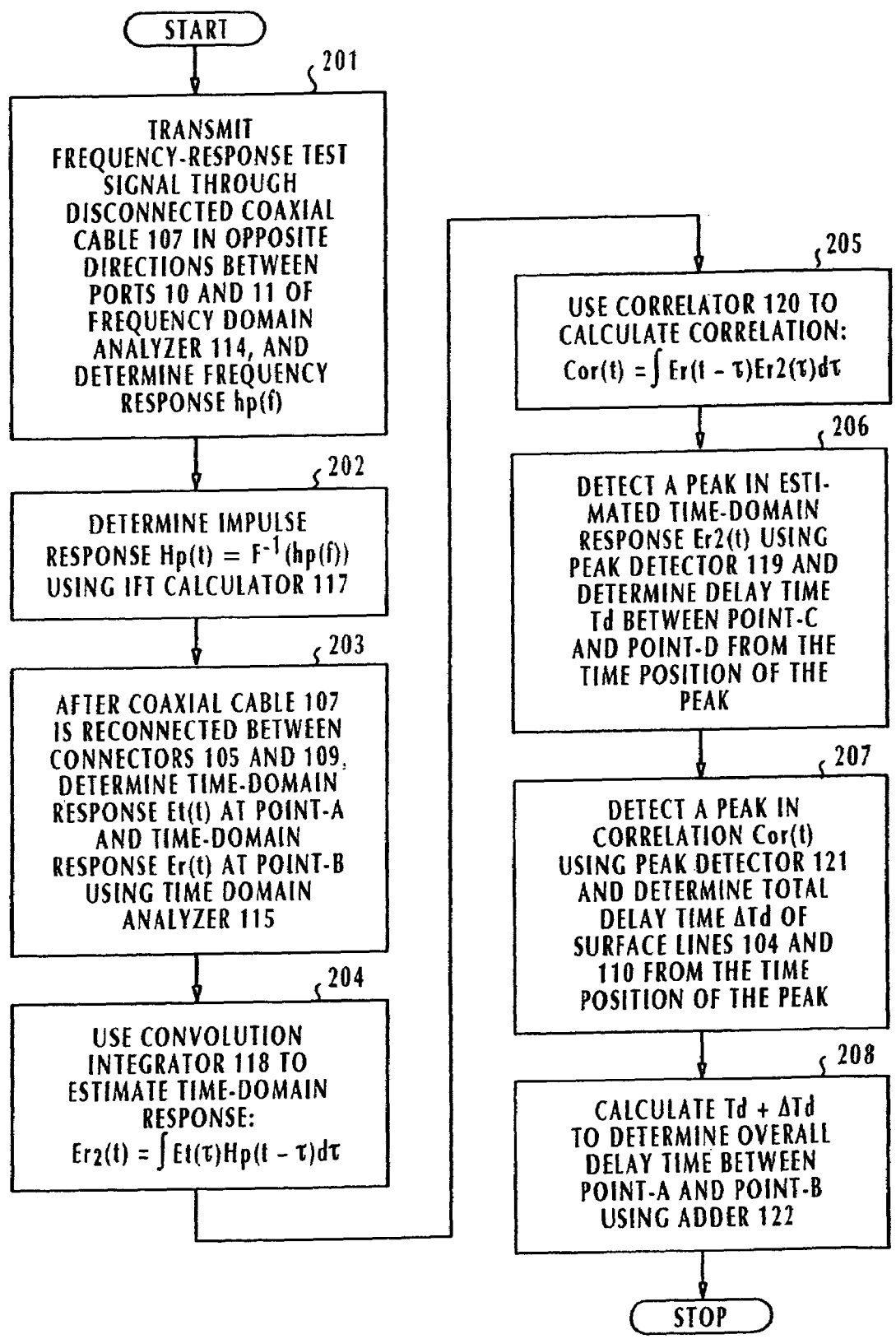
FIG. 5 is a flowchart of the operation of the data processor of FIG. 2.

Peak detection block 120 further detects a peak point in the calculated correlation Cor(t) and determines the delay time ΔTd of the total length of the etched surface lines 104 and 110 from the time position of the detected peak point of the correlation Cor(t) with respect to the peak point of the output of convolution integral calculation block 118 (see graph 37, step 207, FIG. 5).

Adder block 121 is then enabled to add the delay time ΔTd to the delay time Td to obtain the transmission delay time between point-A and point-B (see step 208, FIG. 5).

Since the correlation between the measured receiving-point tine-domain response and the estimated receiving-point time-domain response effectively cancels random noise, the delay time ΔTd can be accurately determined and the amount of time taken to perform a total transmission delay time measurement between points A and B can be significantly reduced in comparison with the prior art approach.

Since frequency response measurement can be made on the transmission medium that can usually be disconnected from the printed circuit boards, precision measurement can be made without using special jigs and the need to use prior art testing non-printed boards for calibrations and a test board for measurement is eliminated.

If high precision measurement is of primary importance, it is necessary to suppress random noise. In this case, frequency domain tests and time domain tests are repeated and the results of the repeated tests are stored in the memory 126. Data processor 116 stores the measured frequency-domain response data (graphs 31 and 33) and the time-domain response data (graph 36) in the memory 126 and averages the values of the stored data.

More specifically, a plurality of frequency-domain responses of the transmission medium are measured and averaged to determine the frequency-domain response hp(f). A plurality of first time-domain responses Et(t) are measured at the sending point A and a plurality of second time-domain responses Er(t) are measured at the receiving point B. The first time-domain responses Et(t) and the second time-domain responses Er(t) are averaged to determine the first and second time-domain responses Et(t) and Er(t).

Figure 6:
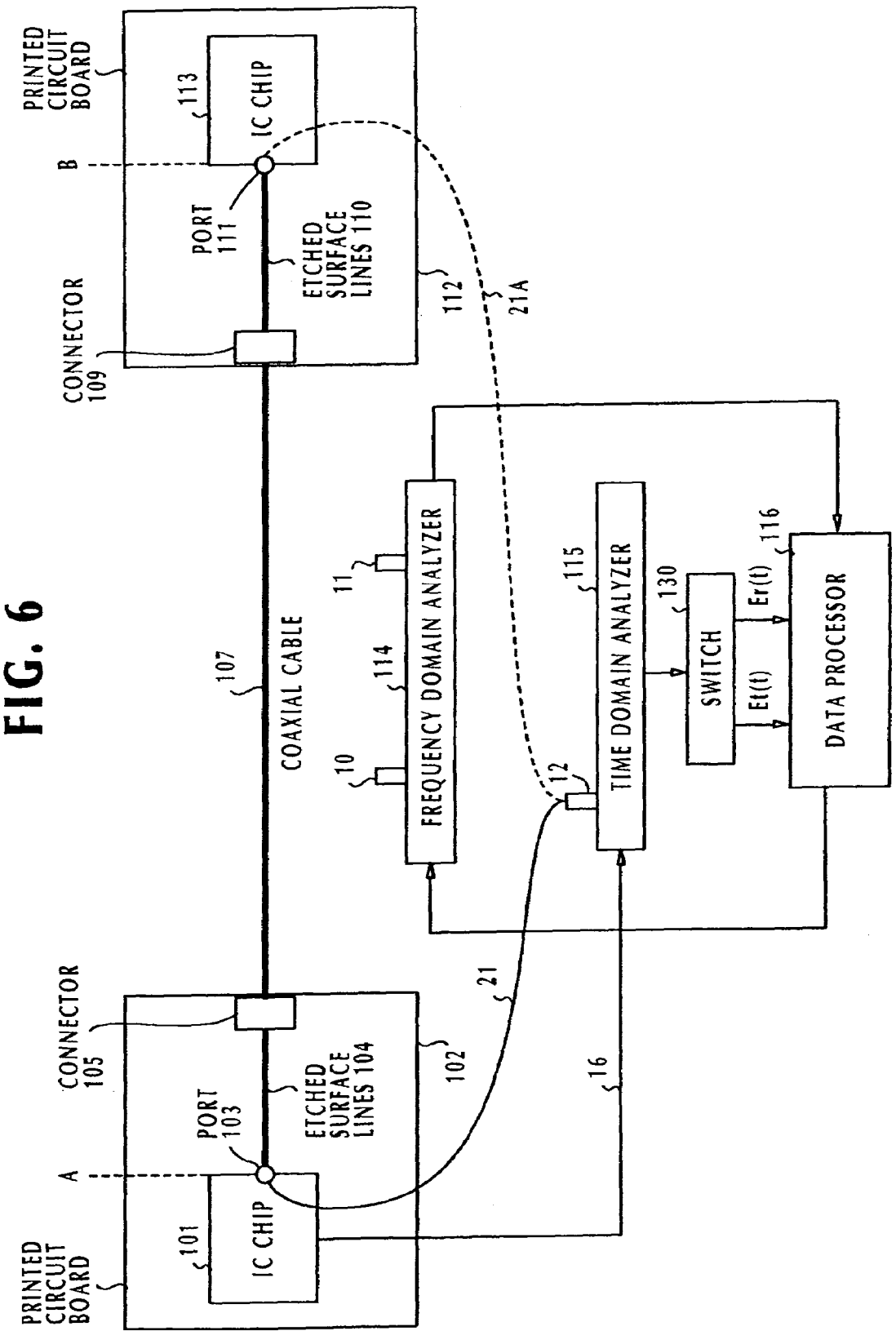
FIG. 6 is a block diagram of a modified form of the time domain test mode.

FIG. 6 illustrates an alternative form of using the time domain analyzer 115 to detect time-domain responses Et(t) and Er(t). In this modification, only one input port 12 is used and a time-domain test signal (either a single pulse or a pulse train) is transmitted at periodic intervals such that the time interval between successive pulses (or pulse trains) is longer than the transmission time of the time-domain test section A-B. During a time domain test mode, the input port 12 of time domain analyzer 115 is initially connected to the port 103. In response to a trigger pulse, the IC chip 101 generates and transmits a time-domain test signal to the time-domain test section A-B. Time domain analyzer 115 responds to this trigger signal by measuring the time-domain response Et(t) of the time-domain test section A-B.

The input port 12 is then removed from the port 103 and connected to the port 111 of the IC chip 113 as indicated by a dotted line 21A. In response to a subsequent trigger pulse, the time domain analyzer 115 measures the time-domain response Er(t) of the time-domain test section A-B. A switch 130 is provided to supply the time-domain response data Et(t) to the convolution integral calculation block 118 when the input port 12 is connected to the port 103. When the input port 12 is connected to the port 111, the switch 130 supplies the time-domain response data Er(t) to the correlation calculation block 119.

The following is a description of a second embodiment of the present invention.

Since Equation (3) can be transformed into Equation (4) as follows, $$Cor(t) = \int Er(t-\tau)Er2(\tau)d\tau = F^{-1}(er(f) \times er2(f))$$

$$= F^{-1}(F(Er(t)) \times (et(f) \times hp(f))$$

$$= F^{-1}(F(Er(t)) \times (F(Et(t)) \times hp(f)) \quad (4)$$

the data processor 116 can be modified so that it initially performs frequency domain calculations and then performs time-domain calculations.

Figure 7:
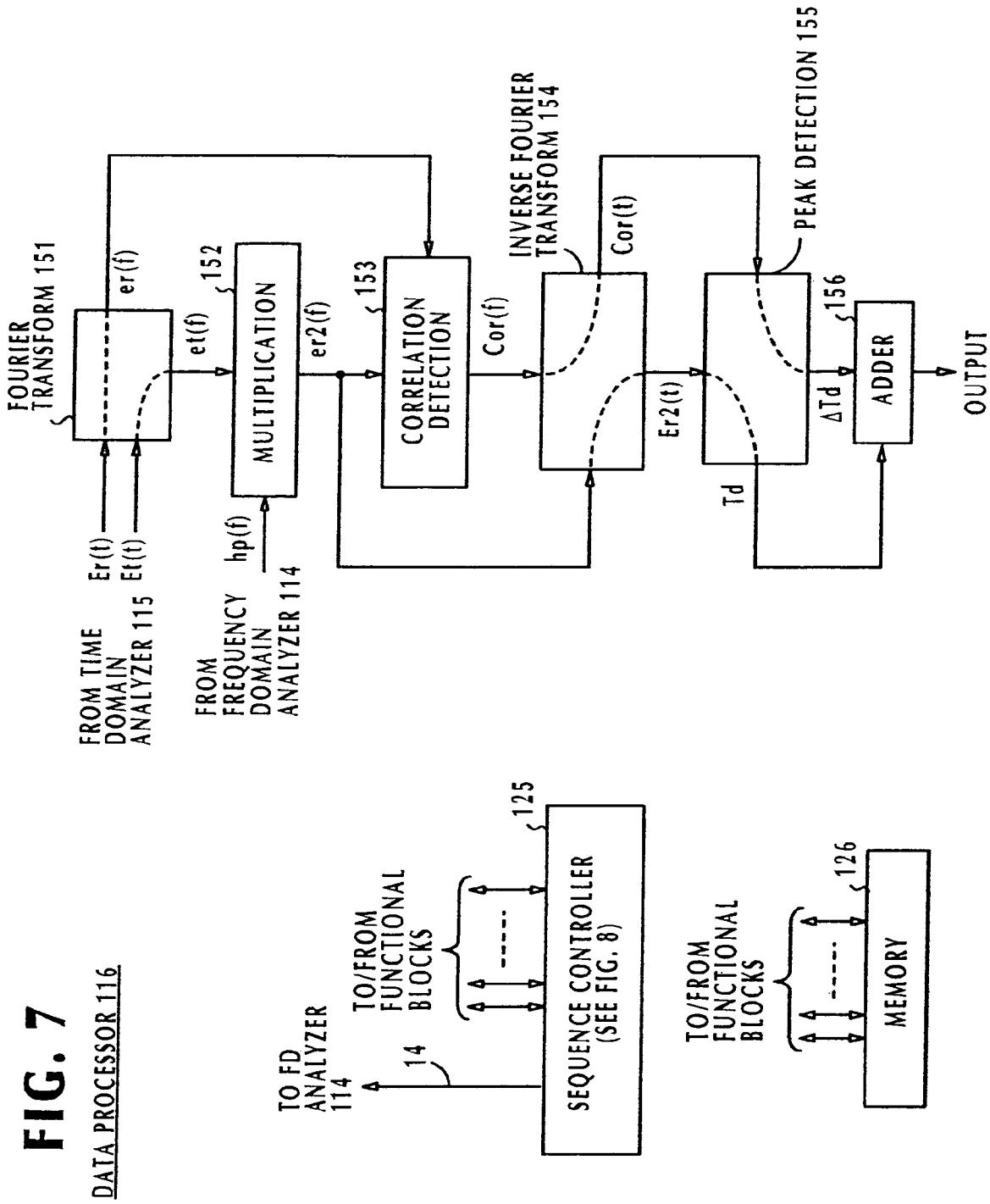
FIG. 7 is a functional block diagram of the data processor that processes the outputs of the frequency and time domain analyzers according to a second embodiment of the present invention.
Figure 8:
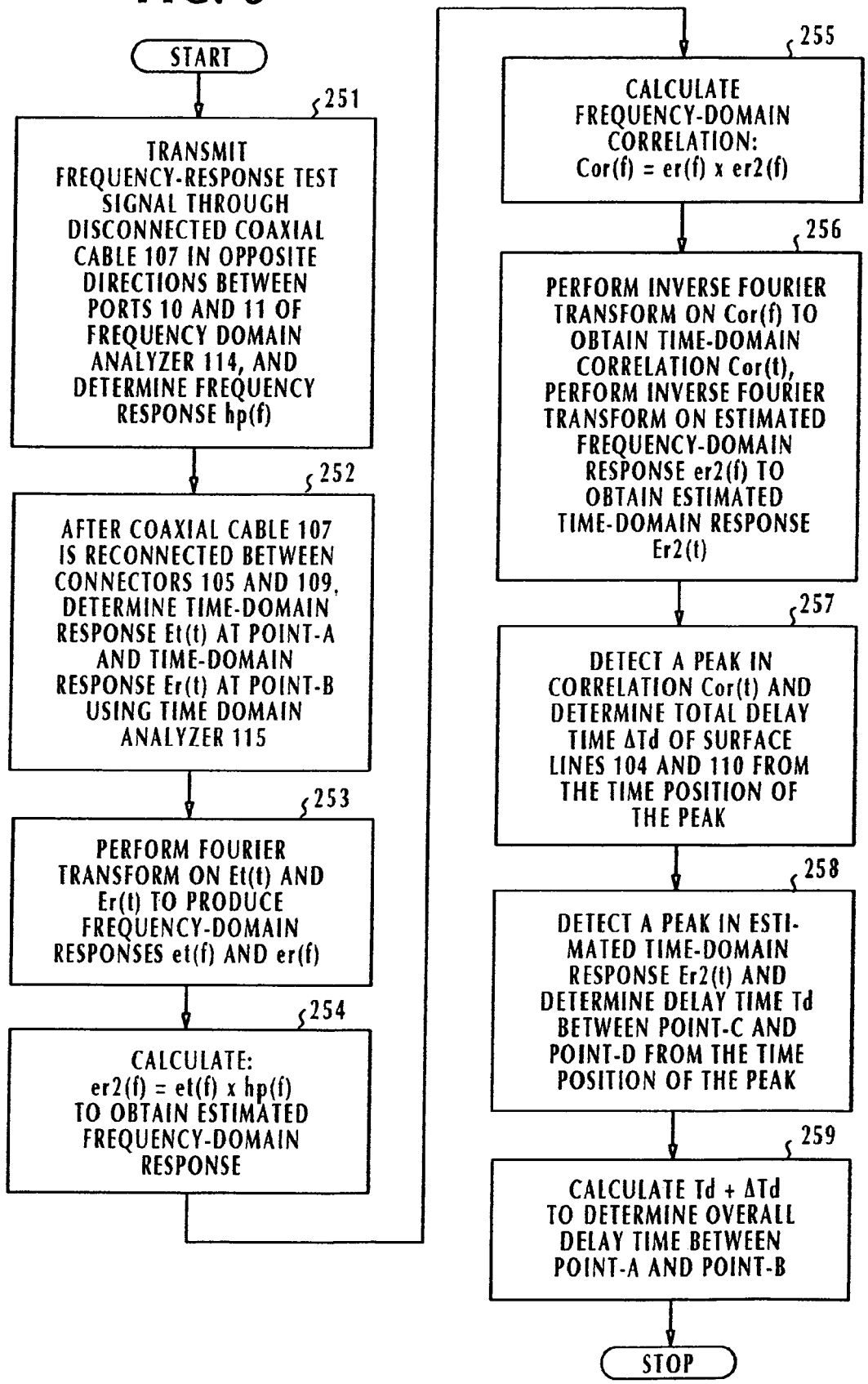
FIG. 8 is a flowchart of the operation of the data processor of FIG. 7.

The data processor 116 of the second embodiment is modified as shown in FIG. 7 and the sequence controller 125 of the modified data processor operates according to the flowchart of FIG. 8.

In a manner similar to that described previously, the frequency domain analyzer 114 measures the amplitude and phase of a transmitted frequency-domain test signal at the sending point of the coaxial cable and its corresponding variations at the receiving point and determines their scattering parameter "$s_{21}$". Using the determined scattering parameter, the frequency domain analyzer 114 performs calibrations at both sending and receiving points and determines a frequency-domain response hp(f) of the coaxial cable 107 (see step 251, FIG. 8). Furthermore, in synchronism with each trigger signal the IC chip 101 transmits a time-domain test signal from its output port 103 into the time domain test section A-B. Time domain analyzer 115 observes the propagation of the test signal using probe wires 21, 22 and samples the pulses at the sending point A and the receiving point B, so that a relatively high SNR test signal is obtained at point A and a relatively low SNR signal is obtained at point B. From the relatively high SNR test signal, the time domain analyzer 115 generates output data Et(t) representing a sending-point time-domain response (waveform) of the time-domain test section. From the received low SNR test signal the time domain analyzer 115 generates output data Er(t) representing a receiving-point time-domain response of the time-domain test section (see step 252, FIG. 8).

Data processor 116 includes a Fourier transform calculation block 151 which performs Fourier transform on the time-domain responses, or waveforms Et(t) and Er(t) from the time domain analyzer 115 to produce frequency-domain responses et(f) and er(f) (see also step 253, FIG. 8).

An estimated frequency-domain response er2(f) is obtained by multiplication block 152 which calculates the following Equation (5) to estimate the frequency-domain response er2(f) (see step 254, FIG. 8).

$$er2(f) = et(f) \times hp(f) \quad (5)$$

In correlation calculation block 153 takes a correlation between the frequency-domain response er(f) and the estimated frequency-domain response er2(f) to obtain frequency-domain correlation Cor(f) (see step 255, FIG. 8) by calculating the following Equation (6):

$$Cor(f) = er(f) \times er2(f) \quad (6)$$

Inverse Fourier transform calculation block 154 performs inverse Fourier transform on the frequency domain correlation Cor(f) to obtain time domain correlation Cor(t) and performs inverse Fourier transform on the estimated frequency-domain response er2(f) to obtain the estimated time-domain response Er2(t) (see step 256, FIG. 8).

Peak detection block 155 detects a peak point in the correlation Cor(t) and determines its time position as a total delay time ΔTd of etched surface lines 104 and 110 (see step 257). Peak detection block 155 is enabled again to detect a peak point in the estimated frequency-domain response Er2(t) and determines its time position as a transmission delay time Td of the coaxial cable 107 (see step 258, FIG. 8).

Addition block 156 adds the delay time ΔTd to the delay time Td to obtain the transmission delay time between point-A and point-B (see step 259, FIG. 8).

Figure 9:
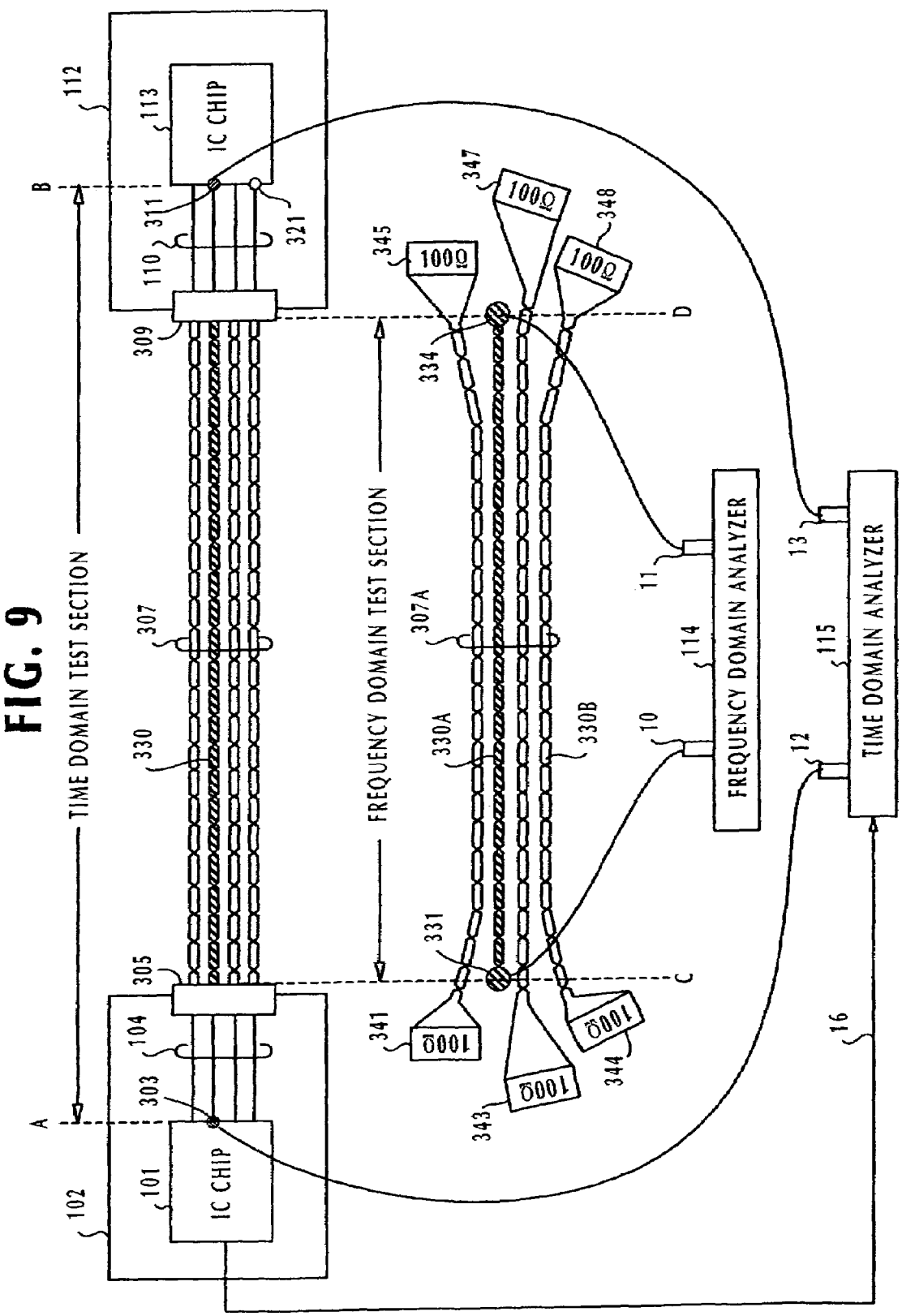
FIG. 9 is a block diagram of the delay time measuring apparatus which is particularly suitable for measuring the propagation delay time of a signal propagation path between two printed circuit boards which are connected by a transmission medium of the type that cannot easily be disconnected from the printed circuit boards.
Figure 10:
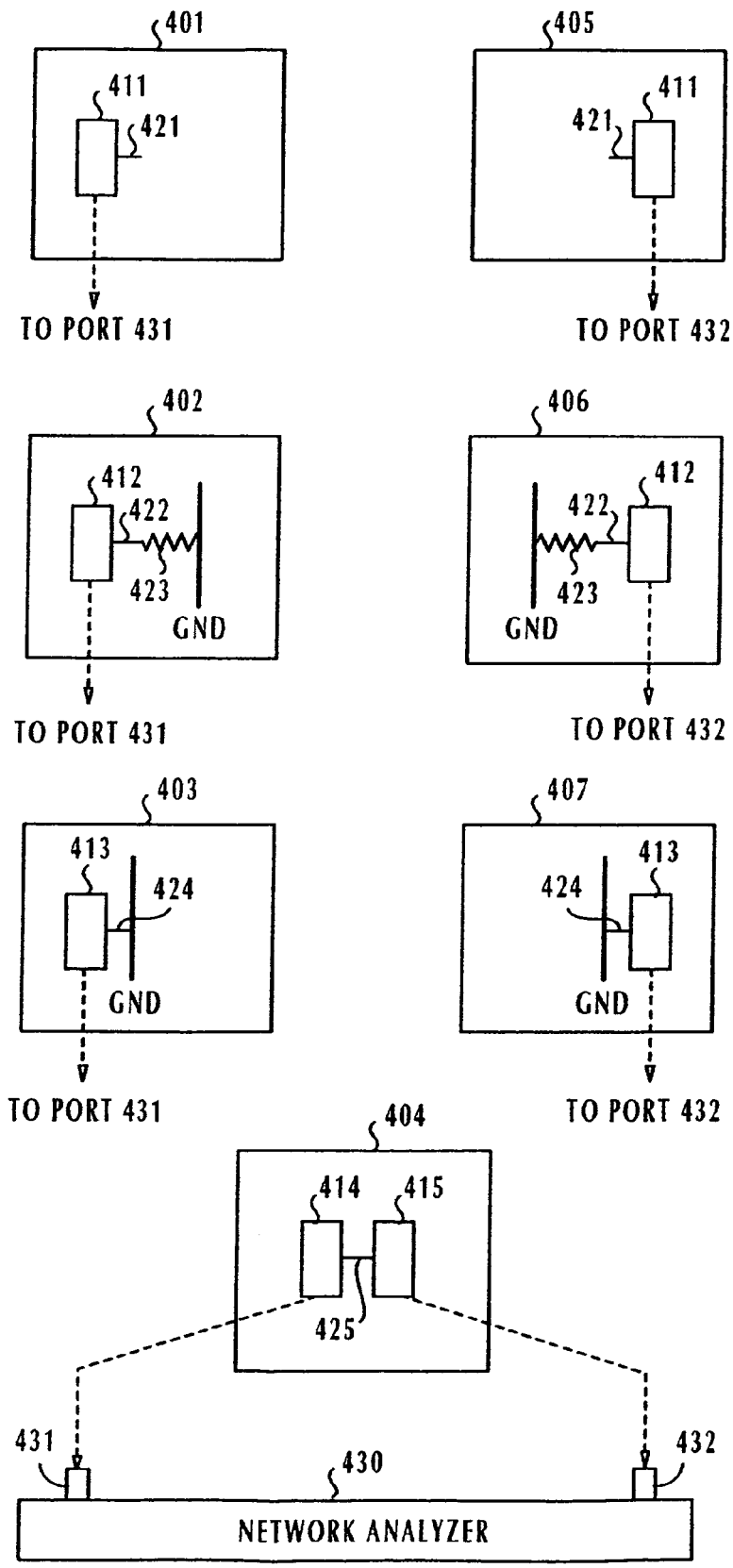
FIG. 10 is an illustration of a number of prior art testing non-printed boards exclusively used for testing a pair of printed circuit boards in different calibration modes.
Figure 11:
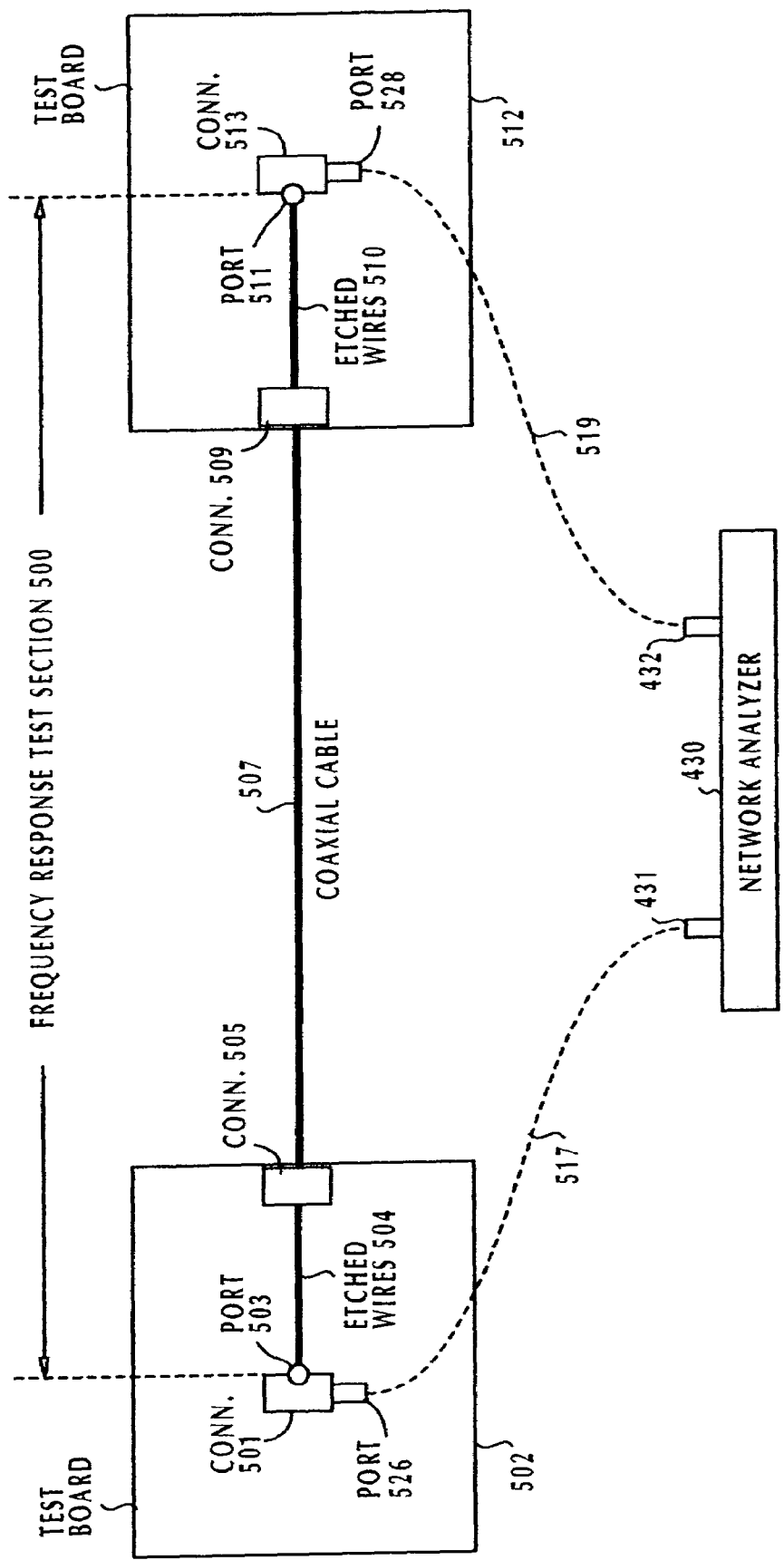
FIG. 11 is a block diagram of a prior art system for measuring the propagation delay time of a transmission line by connecting the transmission line between a pair of test boards exclusively used for the printed circuit boards.

A third embodiment of the present invention is shown in FIG. 9. This embodiment is suitable for applications where the type of a transmission medium used is such that it cannot easily be disconnected from the printed circuit boards, such as UTP (unshielded twisted pairs) cable. Further, the third embodiment of the present invention is particularly useful for applications where propagation delay time can be determined on a running system where live signals are transmitted over the coaxial cable.

As a typical example, a UTP cable 307 with 4 twisted pair wires is used in FIG. 9 as a transmission medium and RJ45 connectors 305 and 309 are used as PCB connectors for connecting the cable 307 to the printed circuit boards.

For testing the frequency-domain response of cable 307, a substitute UTP cable 307A having the same characteristics and length as those of cable 307 is used instead. Termination resistors 341, 343 and 344 are connected to one end of the substitute cable 307A and termination resistors 345, 347 and 348 are connected to the other end of the substitute cable. One of the pairs, designated 330A, is used as a representative line between point-C and point-D for testing its frequency-domain response. Representative line 330A corresponds to the line 330 of the UTP cable 307. The input end 331 of the line 330A is connected to the port 10 of the frequency domain analyzer 114 and the output end 334 of the line 330 is connected to the port 11 of the analyzer 114. Note that the ports 10 and 11 are each fitted with a balun transformer for matching differential outputs to single ended ports.

IC chip 101 has an output port 303 coupled to the port 12 of time domain analyzer 115 and IC chip 113 has an input port 311 coupled to the port 13 of the analyzer 115.

The same procedure as that described previously is used to measure the transmission delay time of the UTP cable 307 with the exception that frequency-domain response measurement is made on the substitute cable 307A and time-domain response measurement is made between point-A and point-B over the UTP cable 307.

Instead of measuring a frequency-domain response on a metallic transmission path, frequency-domain response measurement can also be made on a crosstalk path that can possibly occur in the UTP cable 307 between the output port 303 of IC chip 101 and an input port 321 of IC chip 113, for example. In this case, frequency-domain response measurement is made between line 330A and line 330B. In this case, the termination resistor 348 is disconnected from the line 330B and the port 11 of the frequency domain analyzer 114 is connected to the end of line 330B instead of the termination resistor 348.

What is claimed is:

1. An apparatus for measuring the transmission delay time of a signal propagation path between a sending point of a first printed circuit board and a receiving point of a second printed circuit board, comprising:

a frequency domain analyzer that measures a frequency-domain response of a transmission medium that forms part of said signal propagation path;

a time domain analyzer that measures a first time-domain response of said propagation path at said sending point and a second time-domain response of the propagation path at said receiving point; and a processor that estimates from said first time-domain response and said frequency-domain response a third time-domain response of said propagation path which would be observed at said receiving point if there is no waveform distortion over the surface of each of said printed circuit boards, calculates a time-domain correlation between the second and third time-domain responses, determines a first delay time from said estimated third time-domain response, and determines a second delay time from the calculated time-domain correlation, and provides a sum of the first and second delay times to produce a transmission delay time of said signal propagation path.

2. The apparatus of claim 1, wherein said processor estimates the third time-domain response by converting the frequency-domain response to an impulse response and performing convolution integral calculation on the impulse response and the first time-domain response.

3. The apparatus of claim 2, wherein said processor converts said frequency-domain response to said impulse response by using inverse Fourier transform.

4. The apparatus of claim 2, wherein said processor determines said first delay time between a first peak point of the measured first time-domain response and a second peak point of the estimated third time-domain response, and determines said second delay time from a peak point of the calculated time-domain correlation with respect to a peak point of the calculated convolution integral.

5. The apparatus of claim 1, wherein the processor estimates the third time-domain response of the propagation path by converting the first and second time-domain responses to first and second frequency-domain responses respectively, and multiplying the first frequency-domain response by the measured frequency-domain response to estimate a third frequency-domain response of the propagation path which would be observed at the receiving point, and converting the estimated third frequency-domain response to the third time-domain response.

6. The apparatus of claim 5, wherein said processor converts said estimated third frequency-domain response to said third time-domain response by using inverse Fourier transform.

7. The apparatus of claim 5, wherein said processor calculates a frequency-domain correlation between the converted second frequency-domain response and the estimated third frequency-domain response, and converts the calculated frequency-domain correlation to said time-domain correlation.

8. The apparatus of claim 7, wherein said processor converts said calculated frequency-domain correlation to said time-domain correlation by using inverse Fourier transform.

9. The apparatus of claim 1, wherein said time-domain analyzer includes a probing system that senses signals at any point of said printed circuit boards.

10. The apparatus of claim 1, wherein said time domain analyzer uses a time-domain test signal transmitted at periodic intervals between said first and second printed circuit boards through said signal propagation path.

11. The apparatus of claim 1, wherein said processor includes a memory for storing said frequency-domain response or said time-domain response in said memory and averages the stored response.

12. The apparatus of claim 1, wherein said processor determines said first delay time between a rising point of the measured first time domain response and a rising point of said estimated third time-domain response.

13. A method of measuring the transmission delay time of a signal propagation path between a sending point of a first printed circuit board and a receiving point of a second printed circuit board, comprising the steps of:
  a) measuring a frequency-domain response of a transmission medium that forms part of said signal propagation path and measuring a first time-domain response of said propagation path at said sending point and a second time-domain response of the propagation path at said receiving point;
  b) estimating, from the measured frequency-domain response and the measured first time-domain response, a third time-domain response which would be observed at said receiving point if there is no waveform distortion over the surface of each of said printed circuit boards;
  c) calculating a time-domain correlation between the measured second time-domain response and said estimated third time-domain response;
  d) determining a first delay time from said estimated third time-domain response and determining a second delay time from the calculated time-domain correlation; and
  e) summing the first and second delay times to produce a transmission delay time of said signal propagation path.

14. The method of claim 13, wherein step (b) comprises the steps of:
  b1) converting the frequency-domain response to an impulse response; and
  b2) performing convolution integral calculation on the impulse response and the first time-domain response.

15. The method of claim 14, wherein step (d) comprises the steps of:
  d1) determining said first delay time between a first peak point of the measured first time-domain response and a second peak point of the estimated third time-domain response; and
  d2) determining said second delay time from a peak point of the calculated time-domain correlation with respect to a peak point of the calculated convolution integral.

16. The method of claim 13, wherein step (b1) comprises performing inverse Fourier transform on said frequency-domain response.

17. The method of claim 13, wherein step (b) comprises the steps of:
  b1) converting the first and second time-domain responses to first and second frequency-domain responses respectively;
  b2) multiplying the first frequency-domain response by the measured frequency-domain response to estimate a third frequency-domain response of the propagation path which would be observed at the receiving point; and
  b3) converting the estimated third frequency-domain response to the third time-domain response.

18. The method of claim 17, wherein step (b3) comprises performing inverse Fourier transform on said estimated third frequency-domain response.

19. The method of claim 13, wherein step (c) comprises the steps of:

c1) calculating a frequency-domain correlation between the converted second frequency-domain response and the estimated third frequency-domain response; and c2) converting the calculated frequency-domain correlation to said time-domain correlation.

20. The method of claim 19, wherein step (c2) comprises the step of performing inverse Fourier transform on said calculated frequency-domain correlation.

21. The method of claim 13, wherein step (a) comprises the step of transmitting a time-domain test signal at periodic intervals between said first and second printed circuit boards through said signal propagation path.

22. The method of claim 13, wherein step (a) comprises the steps of storing said measured frequency-domain response or said measured time-domain response in said memory and averaging the stored response.

23. The method of claim 13, wherein step (d) comprises the step of determining said first delay time between a rising point of the measured first time domain response and a rising point of said estimated third time-domain response.

24. The method of claim 13, wherein said transmission medium is disconnected from said first and second printed circuit boards when said frequency-domain response is determined.

25. The method of claim 13, wherein a substitute transmission medium identical to said transmission medium is used instead of said transmission medium, and wherein step (a) comprises the step of measuring said frequency-domain response of said substitute transmission medium.

26. The method of claim 25, wherein said transmission medium is an unshielded twisted pairs cable including a plurality of transmission lines, and wherein step (a) comprises the step of measuring said frequency-domain response of a crosstalk path between said plurality of transmission lines.

27. A computer-readable storage medium storing a program for measuring the transmission delay time of a signal propagation path between a sending point of a first printed circuit board and a receiving point of a second printed circuit board by measuring a frequency-domain response of a transmission medium that forms part of said signal propagation path and measuring a first time-domain response of said propagation path at said sending point and a second time-domain response of the propagation path at said receiving point, said program comprising the steps of:

a) estimating, from the measured frequency-domain response and the measured first time-domain response, a third time-domain response which would be observed at said receiving point if there is no waveform distortion over the surface of each of said printed circuit boards;

b) calculating a time-domain correlation between the measured second time-domain response and said estimated third time-domain response;

c) determining a first delay time from said estimated third time-domain response and determining a second delay time from the calculated time-domain correlation; and d) summing the first and second delay times to produce a transmission delay time of said signal propagation path.

28. The computer-readable storage medium of claim 27, wherein step (a) comprises the steps of:

a1) converting the frequency-domain response to an impulse response; and a2) performing convolution integral calculation on the impulse response and the first time-domain response.

29. The computer-readable storage medium of claim 28, wherein step (c) comprises the steps of:

c1) determining said first delay time between a first peak value of the measured first time-domain response and a second peak value of the estimated third time-domain response; and c2) determining said second delay time from a peak point of the calculated time-domain correlation with respect to a peak point of the calculated convolution integral.

30. The computer-readable storage medium of claim 27, wherein step (a1) comprises performing inverse Fourier transform on said frequency-domain response.

31. The computer-readable storage medium of claim 27, wherein step (a) comprises the steps of:

a1) converting the first and second time-domain responses to first and second frequency-domain responses respectively;

a2) multiplying the first frequency-domain response by the measured frequency-domain response to estimate a third frequency-domain response of the propagation path which would be observed at the receiving point; and a3) converting the estimated third frequency-domain response to the third time-domain response.

32. The computer-readable storage medium of claim 31, wherein step (a3) comprises performing inverse Fourier transform on said estimated third frequency-domain response.

33. The computer-readable storage medium of claim 27, wherein step (b) comprises the steps of:

b1) calculating a frequency-domain correlation between the converted second frequency-domain response and the estimated third frequency-domain response; and b2) converting the calculated frequency-domain correlation to said time-domain correlation.

34. The computer-readable storage medium of claim 33, wherein step (b2) comprises the step of performing inverse Fourier transform on said calculated frequency-domain correlation.

35. The computer-readable storage medium of claim 27, wherein step (a) comprises the steps of storing said measured frequency-domain response or said measured time-domain response in said memory and averaging the stored response.

36. The computer-readable storage medium of claim 27, wherein step (c) comprises the step of determining said first delay time between a rising point of the measured first time domain response and a rising point of said estimated third time-domain response.

* * * * *